(12) United States Patent
Xu (10) Patent No.: US 6,215,316 B1
(45) Date of Patent: Apr. 10, 2001

(54) METHOD AND APPARATUS FOR MEASURING HARMONIC CURRENT SOURCES IN ELECTRIC POWER DISTRIBUTION SYSTEMS

(75) Inventor: Wilsun Xu, Edmonton (CA)

(73) Assignee: The Governor of the University of Alberta, Edmonton (CA)

( * ) Notice: Subject to any disclaimer, the term of this patent is extended or adjusted under 35 U.S.C. 154(b) by 0 days.

(21) Appl. No.: 09/132,288

(22) Filed: Aug. 11, 1998

(51) Int. Cl.$^7$ .................................................. G01R 23/165
(52) U.S. Cl. ........................ 324/623; 324/76.24; 307/106
(58) Field of Search ................................. 702/60, 75, 77; 324/623, 525, 622, 76.19, 76.77, 254, 142; 307/105; 363/39

(56) References Cited

U.S. PATENT DOCUMENTS

| | | | |
|---|---|---|---|
| 4,439,823 | * 3/1984 | Gyugyi et al. | 363/161 |
| 4,667,152 | 5/1987 | Hayes et al. | 324/77 R |
| 5,351,178 | * 9/1994 | Brennen et al. | 363/40 |
| 5,355,025 | * 10/1994 | Moran et al. | 307/105 |
| 5,508,623 | 4/1996 | Heydt et al. | 324/623 |
| 5,731,965 | * 3/1998 | Cheng et al. | 363/41 |

OTHER PUBLICATIONS

Chazottes, B. et al., Estimating the true customers contribution to the power system harmonic disturbances, Source Unknown, 9 pages, EDF–DER Clamart–France. No month/year available.

Yang, H., Assessing the harmonic emission level from one particular customer, Source Unknown, 8 pages, University of Liege–Belgium. No month/year available.

\* cited by examiner

*Primary Examiner*—Safet Metjahic
*Assistant Examiner*—Vincent Q. Nguyen
(74) *Attorney, Agent, or Firm*—Lumen Intellectual Property Services, Inc.

(57) ABSTRACT

A method and apparatus provides a technique for measuring characteristics of a harmonic pollution source connected to an alternating current power distribution system. The apparatus has a harmonic current meter and a harmonic voltage meter. Also, the apparatus has a harmonic perturbation device which can produce changes in the harmonic energy present in the power distribution system. The perturbation device can be a harmonic shunt or a harmonic frequency generator. In operation, harmonic voltage and current measurements are made at the connection point between the harmonic pollution source and the rest of the power distribution system. One set of voltage and current measurements is made with the harmonic perturbation device connected and one set of measurements is made with the harmonic perturbation device disconnected. The measurements are performed at the frequencies of interest. The two sets of measurements provide enough information to solve a set of equations which reveal characteristics of the harmonic pollution source. For example, the harmonic current magnitude and impedance of the harmonic pollution source can be found.

38 Claims, 8 Drawing Sheets

METHOD AND APPARATUS FOR MEASURING HARMONIC CURRENT SOURCES IN ELECTRIC POWER DISTRIBUTION SYSTEMS

RELATED APPLICATIONS

This application is related to patent application "Method for Quantifying Harmonic Pollution Sources" by Wilsun Xu, filed concurrently with the present application.

FIELD OF THE INVENTION

This invention relates generally to devices and methods for measuring harmonic pollution sources in electrical power distribution systems. More particularly, it relates to a method and apparatus for measuring the harmonic pollution generated in localized regions of a power distribution system.

BACKGROUND OF THE INVENTION

Alternating current networks and devices are typically designed to operate on sinusoidal 50 Hz or 60 Hz alternating voltages and currents. The voltage and current waveforms in modern power distribution systems are seldom sinusoidal, however, because of the increased use of nonlinear electrical loads such as variable speed motor drives. Such nonlinear loads draw a nonsinusoidal current from a sinusoidal voltage source. This results in a waveform distortion which propagates outward from the nonlinear electrical load into the network. The distorted waveform includes frequency components which are multiples of the original frequency of the electrical power (50 Hz or 60 Hz). These high frequency components are called harmonics. The harmonics are created by the nonlinear electrical load. In 60 Hz power distribution systems, harmonics at 300 HZ, 420 Hz, and 660 Hz and other odd-multiples of frequency are particularly significant. It is desirable to limit the production and propagation of harmonics because harmonics can disrupt and damage sensitive electrical devices drawing power from the power distribution system.

One problem with limiting the production of harmonics is that they are difficult to trace. Their source cannot easily be found and measured. Electric customers such as a factory create harmonic pollution which is spread by the distribution system to other customers. Other customers may experience problems due to the harmonics, but the source of the offending harmonics is difficult to identify. If harmonic current sources could be located and measured, harmonic polluters could be required to reduce their harmonic output to comply with specified limits.

There are many commercially available instruments designed to measure parameters of harmonic disturbances such as the magnitudes of the harmonic currents and voltages. Some such instruments measure the direction of harmonic energy flow, thereby helping to locate the harmonic current source. If the energy flows from the left to the right of the metering point, the harmonic power source is on the left, and vice versa. U.S. Pat. No. 4,667,152 to Hayes et. al., and U.S. Pat. No. 5,508,623 to Heydt et. al. operate according to this principle. This technique, however, has the following major shortcomings:

1) It only detects the net direction of harmonic energy flow. The method cannot determine if there are harmonic current sources on both sides of the metering point.
2) The method is qualitative. It is unable to measure the relative contributions of different harmonic current sources if the sources are located on opposite sides of the metering point.
3) The method detects direction based on net harmonic power. Intervening impedances can result in misleading information about the locations of the harmonic current sources. For example, it is possible for the right side harmonic current source to produce more harmonic energy, but for the net harmonic energy flow to be from left to right.

What is needed is a technique for measuring a harmonic energy flow which does not suffer from the above disadvantages and which can accurately identify producers of harmonic pollution.

OBJECTS AND ADVANTAGES OF THE INVENTION

Accordingly, it is a primary object of the present invention to provide a method and apparatus for characterizing and locating harmonic pollution sources that:

1) is able to quantitatively measure the strength of a single harmonic pollution source even when there are multiple harmonic current sources connected to the power distribution network; and
2) yields correct measurements of a harmonic current source when there exist unknown impedances between the measurement point and the harmonic current source.

These and other objects and advantages will be apparent upon reading the following description and accompanying drawings.

SUMMARY OF THE INVENTION

The above objects and advantages are attained by an apparatus for determining a characteristic of a harmonic pollution source of interest connected to a power line. The harmonic pollution source is connected to the power line at a connection point. The harmonic pollution source of interest and power line comprise part of a power distribution system. The apparatus has a harmonic perturbation device for changing the harmonic energy present in the power distribution system. The perturbation device can increase, decrease or change the phase of harmonic energy in the power distribution system. The apparatus also has a means for connecting the perturbation device to the distribution system, a means for measuring a harmonic voltage at the connection point, and a means for measuring a harmonic current flowing between the connection point and the harmonic current source. The measurements from the current and voltage meters with and without the perturbation of the harmonic energy in the power distribution system allow one to determine characteristics of the harmonic current source.

The harmonic perturbation device can generate harmonic current, absorb harmonic current, or change the phase of harmonic current at the frequency of interest. In the preferred embodiment, the perturbation device is a harmonic shunt connected in parallel with the harmonic pollution source of interest. Alternatively, the perturbation device is a frequency generator which generates harmonic current at the frequencies of interest.

Also preferably, the harmonic perturbation device is connected at the connection point between the power line and harmonic pollution source of interest.

The present apparatus is capable of determining many characteristics of the harmonic pollution source of interest. Examples of characteristics which can be determined include the magnitude of harmonic current produced by the harmonic pollution source of interest, the phase of the harmonic current, and an impedance associated with the harmonic pollution source of interest. Of course, the phase, current magnitude, and impedance are typically different at each harmonic frequency. The apparatus may include a computer to perform the calculations necessary to determine characteristics of the harmonic pollution source from the current and voltage measurements.

The present invention can also include a switch for selectively connecting between the different power lines in a 3-phase power system.

The present invention also includes an embodiment without a harmonic perturbation device. Instead, the apparatus has a means for monitoring the harmonic voltage and harmonic current and a means for storing the voltage and current measurements. This embodiment relies upon spontaneous temporal fluctuations in the harmonic pollution source (fluctuations in harmonic voltage or harmonic current). When a fluctuation is detected, voltage and current measurements before and after the fluctuation are used to calculate characteristics of the harmonic pollution source. A larger fluctuation results in a more accurate determination of the harmonic pollution source characteristics.

DETAILED DESCRIPTION

Figure 1:
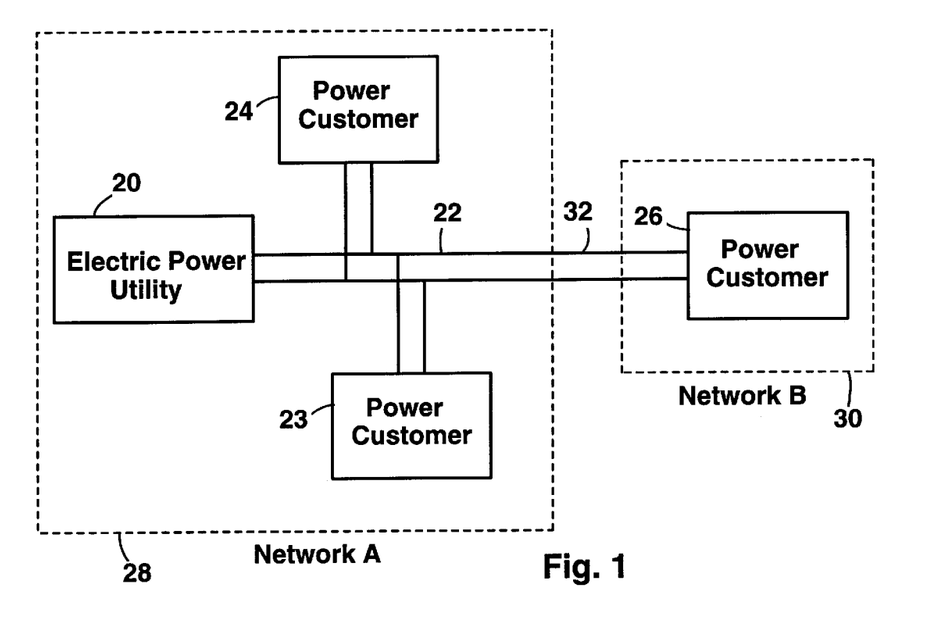
FIG. 1 shows a power distribution system to which the present invention is applicable.

FIG. 1 shows a schematic illustration of an electric power distribution system as commonly used to distribute electrical power. An electric utility 20 generates alternating current electrical power which is distributed via power lines 22 to electric customers 23, 24, 26. The power lines 22, utility 20, and customers 23, 24, 26 are considered to comprise parts of a power distribution system in the present application. The electric utility 20 and each customer 23, 24, 26 is a harmonic pollution source, producing harmonic pollution which is distributed throughout the power distribution system. Since there are multiple harmonic pollution sources 20, 23, 24, 26 connected to the same power lines 22 in any real-world system, the harmonic pollution from all the sources is mixed together.

The present invention is capable of determining characteristics of a single harmonic pollution source of interest (e.g. customer 26) without being affected by other harmonic pollution sources (e.g. utility 20, and other customers 23, 24) which are connected to the same power lines 22. In the example set forth below, the present invention determines characteristics of customer 26 (the harmonic pollution source of interest) without being affected by the other pollution sources 20, 23, 24. However, it is understood that the present invention can determine harmonic pollution characteristics of the other customers 23, 24, the utility 20 or even of a combination of the utility 20 and other customers 23, 24.

In the present specification, the term 'harmonic' refers to any frequency different from the principle frequency of the alternating current electrical power. For example, in 60 Hz power systems, examples of common harmonics are 300 Hz, 420 Hz, and 540 Hz.

For the purpose of determining harmonic pollution characteristics of the customer 26, the power distribution system shown in FIG. 1 can be broken up into a network A 28 and a network B 30. Network B consists of the customer 26. Network A comprises all the other relevant components such as the utility 20, power lines 22 and other customers 23, 24. A connection point 32 between the customer 26 and the power line 22 lies at the boundary between network A and network B. The location of the connection point 32 determines what is in network A and what is in network B. The connection point 32 is typically located at the customer's property boundary (i.e. the electric power metering point) between the customer 26 and the rest of the system.

Figure 2:
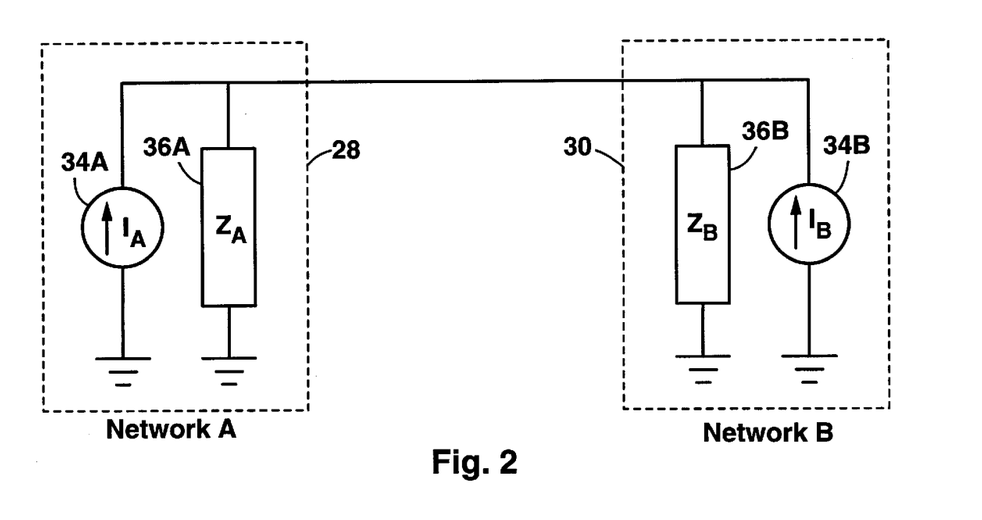
FIG. 2 shows an equivalent circuit of the power distribution system of FIG. 1, in which power customer 26 is the harmonic pollution source of interest.

FIG. 2 shows an equivalent circuit of the network A and the network B of FIG. 1. Network A 28 is modeled as a network A harmonic current source 34A and a network A impedance 36A connected in parallel with the network A harmonic current source 34A. The network A impedance has an impedance value denoted by $Z_A$. The network A harmonic current source produces harmonic currents denoted by $I_A$. Network B 30 contains a network B harmonic current source 34B and a network B impedance 36B connected in parallel with the current source 34B. The network B harmonic current source 34B is within network B. The network B impedance has an impedance value denoted by $Z_B$. The network B harmonic current source produces harmonic currents denoted by $I_B$. The impedance values $Z_A$ and $Z_B$ are typically quite different and are frequency dependent. Also, the harmonic current values $I_A$ and $I_B$ are typically different and are frequency dependent. The currents ($I_A$ and $I_B$) and impedances ($Z_A$ and $Z_B$) are preferably represented by complex variables. Network B is considered to be the harmonic source of interest in the model of FIG. 2.

The harmonic pollution source of interest 30 is connected to the power line 22 at the connection point 32. Typically, the connection point is where power is metered.

Figure 3:
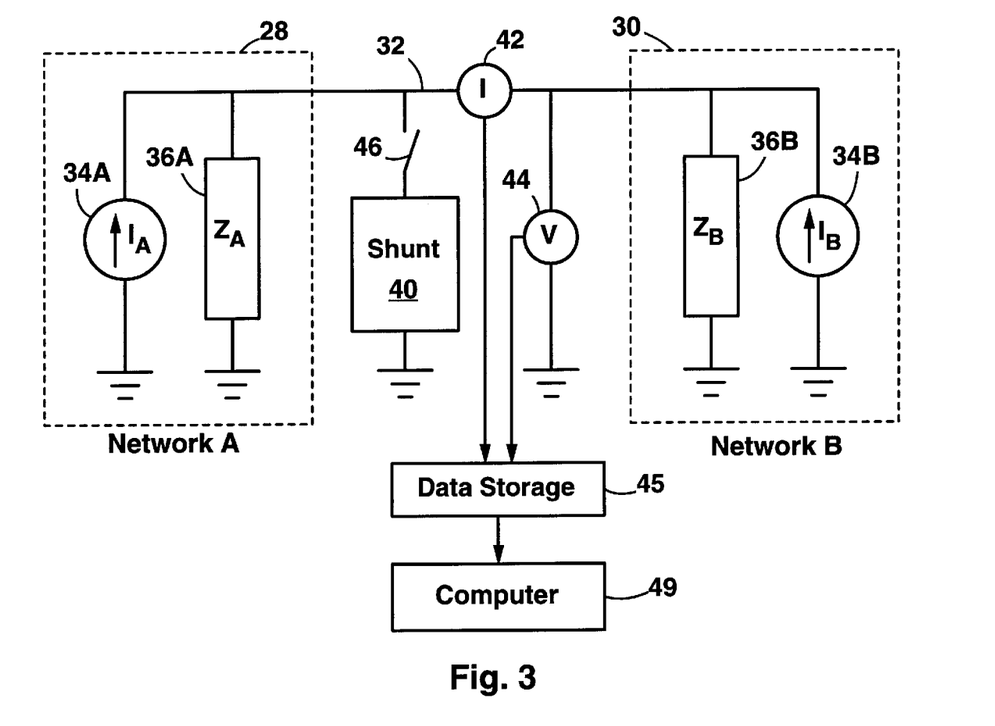
FIG. 3 shows a preferred embodiment connected to the equivalent circuit of FIG. 2.

FIG. 3 shows the circuit of FIG. 2 in combination with an embodiment of the present invention capable of determining many characteristics of network B (the harmonic pollution source of interest). The present invention includes a harmonic shunt 40, a harmonic current meter 42, a harmonic voltage meter 44, and a switch or relay 46 for connecting the shunt 40 to the connection point 32 in parallel with the network B harmonic current source 34B. Measurements from the current meter 42 and voltage meter 44 are stored in a data storage device 45. Preferably, the apparatus also includes a computer 49 for performing calculations with the measurement data stored in the data storage device 45. In many applications it is of interest to measure the magnitude of harmonic current produced by the network B harmonic current source 34B because this provides the most relevant measure of harmonic pollution. A measurement of the magnitude of harmonic current produced by the network B harmonic current source 34B indicates how much harmonic pollution network B 30 is capable of releasing into the power distribution system. The present invention can measure the magnitude of harmonic current produced by the network B harmonic current source 34B at any harmonic frequency of interest.

The harmonic shunt 40 is a harmonic perturbation device which generates and/or absorbs harmonic energy. A shunt which generates harmonic energy is called a harmonic current generator or a harmonic voltage generator. A shunt which absorbs harmonic energy is called a harmonic absorber. Four examples of harmonic generators are shown in FIGS. 4A–4D. These harmonic generators have thyristors 41 such as SCRs which are switched according to a pattern (i.e. switched at a harmonic frequency) which results in the generation of a predetermined harmonic frequency spectrum. Alternatively, thyristors 41 can be replaced with other switching devices such as gate turn-off thyristors (GTOs) or insulated gate bipolar transistors (IGBTs). The harmonic generators shown in FIGS. 4A–4D produce harmonic frequencies when exposed to a pure sinusoidal alternating voltage (or DC voltage) and switched appropriately.

Figure 4A:
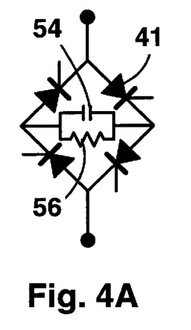
FIGS. 4A through 4F show harmonic shunts which can be used in the present invention.
Figure 4B:
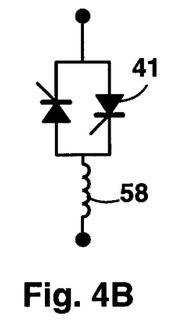
Figure 4C:
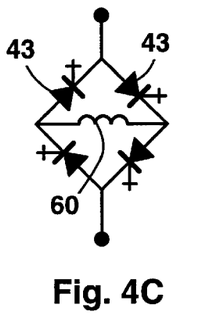
Figure 4D:
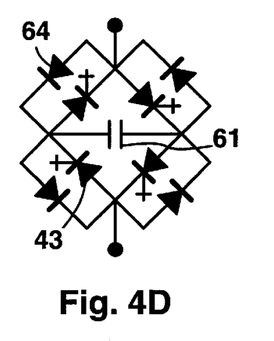

More specifically, FIG. 4A shows a current generator having four thyristors 41 connected in an H-bridge circuit with a capacitor 54 and resistor 56. FIG. 4B shows a current generator having two anti-parallel thyristors in series with an inductor 58. More generally, inductor 58 can be replaced with any reactance including a capacitor. FIG. 4C shows a current generator having four GTOs 43 connected in an H-bridge circuit with an inductor 60. FIG. 4D shows a voltage generator having four GTOs 43 connected in an H-bridge circuit with a capacitor 61. The GTOs in the device of FIG. 4D also have associated antiparallel diodes 64.

In the present invention it is preferable to use voltage generators such as the device of FIG. 4D. The use of voltage generators is preferred over current generators because voltage generators provide for more accurate measurements. In the art of power electronics, voltage generators are often referred to as voltage source inverters and current generators are often referred to a current source inverters. Current source inverters and voltage source inverters are commonly used in the power electronics art to generate new frequencies in an electric circuit, or to generate AC power from DC power.

Figure 4E:
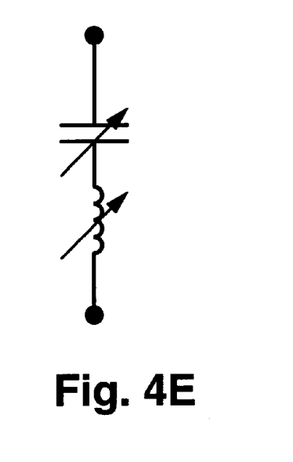
Figure 4F:
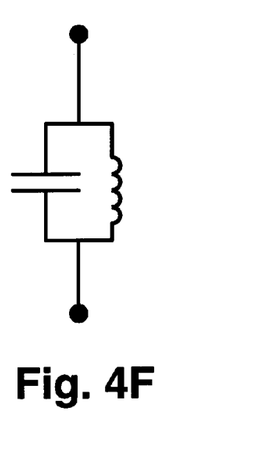

FIGS. 4E and 4F show two examples of harmonic absorbers which can be used as harmonic shunts. FIG. 4E shows a harmonic absorber having a capacitor and inductor connected in series. The capacitor and inductor are variable and so can be changed to tune the absorber to particular harmonic frequencies of interest. FIG. 4F shows a harmonic absorber having a fixed capacitor and fixed inductor connected in parallel. It is noted that the capacitors and inductors of FIGS. 4E and 4F should be selected so that the absorbers do not dissipate energy at the frequency of the power line (e.g. 60 Hz). The harmonic absorbers do not produce harmonic frequencies. When connected to the connection point, the harmonic absorbers absorb harmonic energy from the power distribution system. Most generally, the harmonic perturbation device (harmonic shunt 40), whether a harmonic current/voltage generator or harmonic absorber, changes the harmonic energy present in the power distribution system.

The harmonic current meter 42 is a device which measures the current flow at the harmonic frequencies of interest. Many such devices are known in the art and are commercially available. Preferably, the harmonic current meter 42 simultaneously measures amplitude and phase at all the harmonic frequencies of interest. In the preferred embodiment, this is accomplished by digitizing and storing the current waveform and then performing a Fourier transform calculation on the digitally stored waveform. The Fourier transform calculation can be performed with the computer 49.

The harmonic voltage meter 44 is a device which measures the voltage at the harmonic frequencies of interest. Preferably, the harmonic voltage meter simultaneously measures the amplitude and phase at all the harmonic frequencies of interest. In the preferred embodiment, this is accomplished by digitizing and storing the voltage waveform and performing a Fourier transform calculation on the digitally stored waveform.

The switch 46 can be a mechanical or electronic switch or relay. Preferably, the switch 46 has a fast switching time and a low impedance. Preferably, the connection point 32 is close to the metering point of electrical energy consumed by the customer 26 that is being monitored for harmonic pollution.

The operation will be described starting with the state of the device wherein the shunt 40 is disconnected from the network by the switch 46. While the shunt is disconnected, measurements are simultaneously performed by the harmonic current meter 42 and the harmonic voltage meter 44 at all the harmonic frequencies of interest. Preferably, the amplitude and phase is measured at all the frequencies of interest by digitizing and storing the current and voltage waveforms. The measurements yield complex values $I_0$ and $V_0$ for the harmonic current and voltage, respectively, for each harmonic frequency.

Next, the switch 46 is closed and the shunt is connected in parallel with the network B harmonic current source 34B. While the shunt is connected, measurements are simultaneously performed by the harmonic current meter 42 and the harmonic voltage meter 44 at all the harmonic frequencies of interest (i.e., the same frequencies as in the first measurement). The shunt changes the harmonic energy (i.e. the amplitude or phase of harmonic energy) present in the power distribution system and therefore the measurements taken by the current 42 and voltage 44 meters will be different from the measurements previously taken when the shunt was disconnected from the network. The measurements taken while the shunt is connected yield complex values $I_1$ and $V_1$ for the harmonic current and voltage, respectively, for each harmonic frequency. Preferably, the shunt is designed such that the difference between the values $V_0$ and $V_1$ is large at all the frequencies of interest and the difference bewteen the values $I_0$ and $I_1$ is large at all the frequencies of interest. A large difference in the values is understood to mean a difference that is sufficiently large to provide accurate determination of the harmonic distortion.

For the first set of measurements taken with the shunt disconnected, the following equation can be written based on Ohms law:

$$I_B + I_0 = \frac{V_0}{Z_B},$$

where $I_B$ represents the harmonic current produced by the network B harmonic current source 34B.

For the second set of measurements taken with the shunt connected, the following equation can be written:

$$I_B + I_1 = \frac{V_1}{Z_B}$$

Combining and algebraically manipulating the two above equations yields the result:

$$I_B = \frac{\frac{V_0}{V_1}I_1 - I}{1 - \frac{V_0}{V_1}}.$$

The magnitude and phase of the harmonic current produced by the network B harmonic current source 34B is thereby provided from the measurements of $I_0$, $I_1$, $V_0$, and $V_1$.

Similarly, the network B impedance $Z_B$ can be calculated from $I_0$, $I_1$, $V_0$, and $V_1$ according to the equation:

$$Z_B = \frac{V_0 - V_1}{I_0 - I_1}.$$

Of course, the variables $I_0$, $I_1$, $V_0$, and $V_1$ must be complex if the complex impedance is to be found.

Also, as is known in the art of complex analysis, the phase of the harmonic current produced by the harmonic current source 34B can be determined by the following equation:

$$\text{Phase} = \text{Tan}^{-1}\left(\frac{\text{Re}(I_B)}{\text{Im}(I_B)}\right).$$

The computer 49 can perform the calculations for the above equations so that useful numerical values for the harmonic current, phase and impedance are provided.

Figure 5:
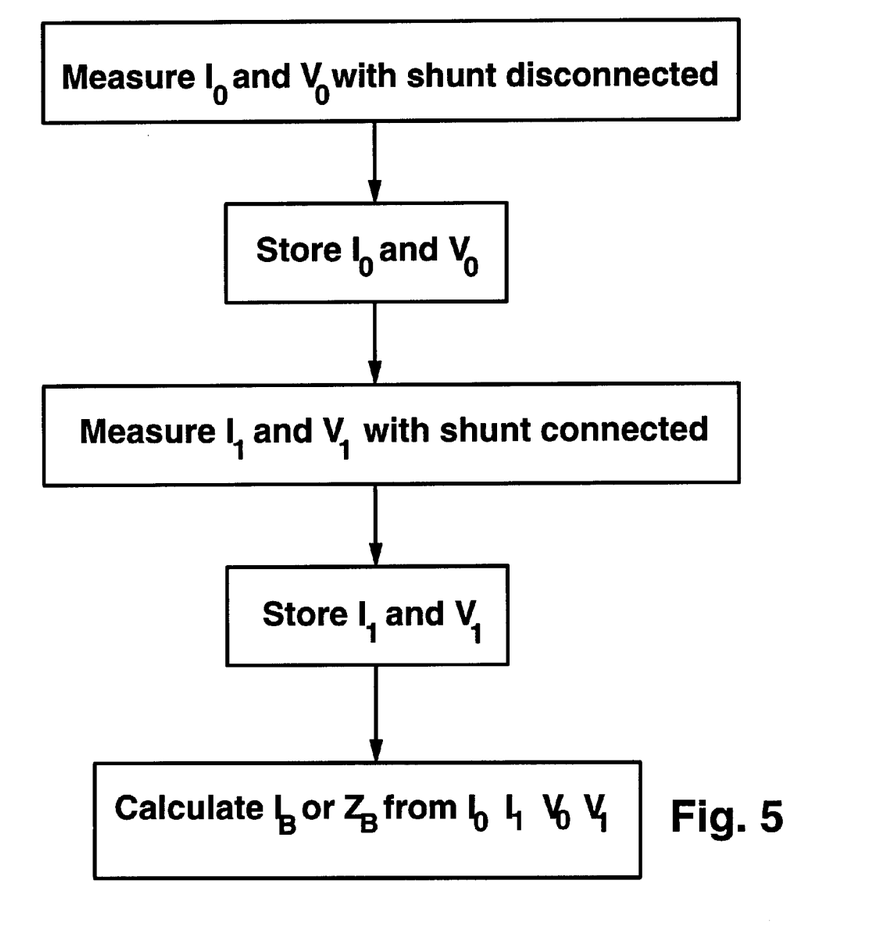
FIG. 5 is a flow chart illustrating the preferred method of the present invention.

FIG. 5 shows a flow chart illustrating the preferred embodiment of the method of the present invention.

It is noted that the shunt is preferably connected only briefly to the connection point 32. This is because the shunt will invariably dissipate energy while connected. More powerful, more expensive shunt circuitry is required if the shunt is connected for a long period of time. For minimal shunt cost and complexity, the shunt should be connected for as short a duration as possible while still allowing for accurate harmonic measurements. In a particular embodiment, the shunt is connected for about 2 seconds. In a 60 Hz system, this provides 120 periods over which measurements are taken, which is enough to produce fairly accurate results.

It can be seen from the above equations that the values $V_0$ and $V_1$ must be substantially different in order to accurately measure the harmonic current produced by the network B harmonic current source 34B. The calculated values of harmonic current, phase and impedance are more accurate if the difference between the measured values of $V_0$ and $V_1$ is made larger. This is why it is beneficial to use a harmonic voltage generator instead of a harmonic current generator as the harmonic shunt 40. In order for $V_0$ and $V_1$ to be substantially different, the shunt must have a large effect upon the harmonic energy present in the power distribution system. The shunt can either generate a large amount of harmonic energy or absorb a large amount of harmonic energy. The larger the change caused by the shunt at the harmonic frequencies, the more accurate the measurements will be. Also, the shunt can cause a change in the amount or phase of harmonic energy present at the frequencies of interest.

Figure 6:
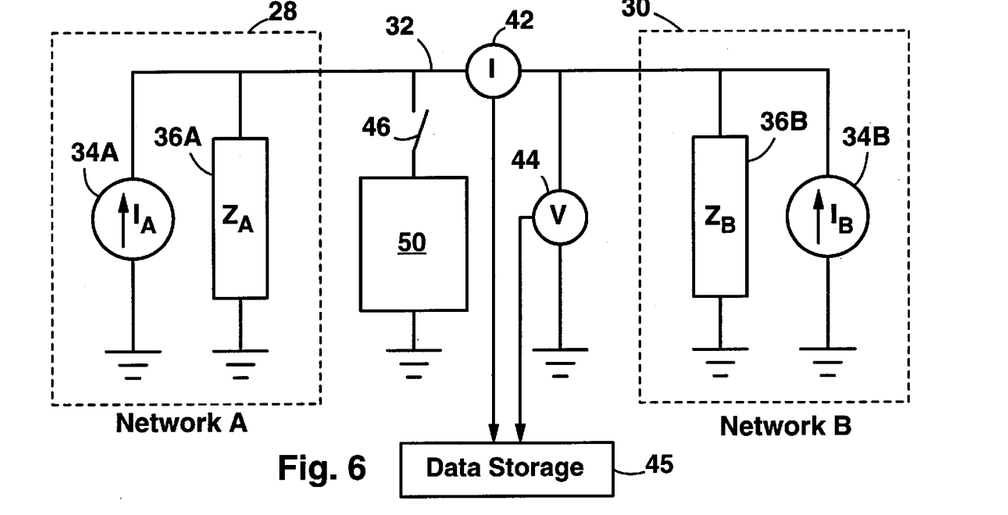
FIG. 6 shows an embodiment of the present invention in which a harmonic signal generator is used instead of the harmonic shunt.

FIG. 6 shows an alternative embodiment of the present invention in which the harmonic shunt 40 is replaced with a harmonic frequency generator 50. The frequency generator can be an active signal generator calibrated to produce the harmonic frequencies of interest. The frequency generator injects harmonic energy into the power distribution system. The frequency generator injects harmonics into the system while $I_1$ and $V_1$ are measured.

It is noted that the harmonic shunt 40 or harmonic frequency generator 50 does not need to be connected at the connection point 32. The harmonic shunt can be connected anywhere in the power distribution system such as at the utility 20, anywhere along the power line 22 or even at the customers 23, 24 whose harmonic pollution is not of interest. The only requirement is for the harmonic shunt 40 to change the harmonic energy present in the power distribution system between the times that the measurements are taken, and this can be accomplished by connecting the shunt 40 or generator 50 at many possible locations in the network. If the harmonic perturbation device is physically separated from the connection point where the measurement is made, then a communication means for correlating the time of perturbation with the times of measurement may be provided. Alternatively, measurements may be made continuously as described below in relation to FIG. 10, in which case no such communication means is necessary.

It is noted that the harmonic frequency generator 50 and harmonic shunt 40 are examples of harmonic perturbation devices. When connected, a harmonic perturbation device changes the phase or amount of harmonic energy in the power distribution system.

A harmonic perturbation device increases or decrease the amount or phase of harmonic energy present in the power distribution system. In other words, connection of a harmonic perturbation device changes $V_0$ to $V_1$ and $I_0$ to $I_1$. A harmonic perturbation device with a large perturbation effect results in a large difference between $V_0$ and $V_1$. For accurate measurements of a harmonic current source, it is best for the difference between $V_0$ and $V_1$ to be large.

Figure 7:
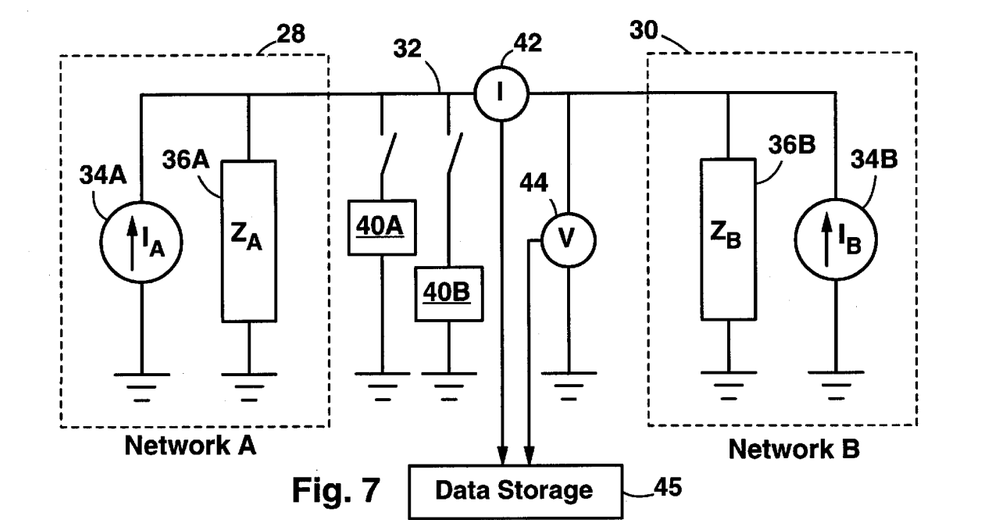
FIG. 7 is an embodiment of the present invention in which two harmonic shunts are used in combination.

In an alternative embodiment shown in FIG. 7, two different shunts 40A, 40B are used. Each shunt 40A, 40B is designed for measurements at particular harmonic frequencies. In this way, each shunt can be optimized for a particular harmonic frequency or range of frequencies, and the accuracy of the measurement at each frequency is improved. Any number of different shunts can be used in combination. Each shunt can have its own switch, or several shunts can be connected to the connection point through a single switch.

Figure 8:
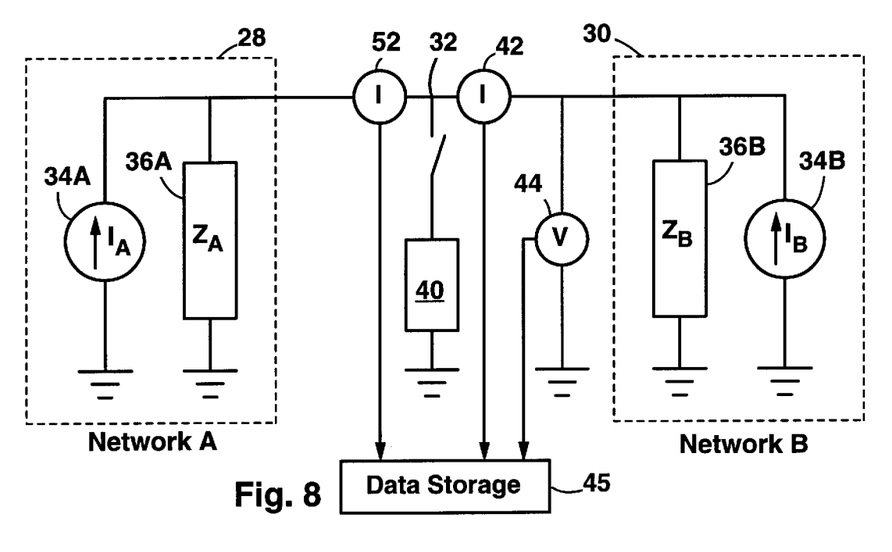
FIG. 8 is an embodiment of the present invention which is capable of measuring characteristics of both network A and network B.

In many situations it is desirable to measure the relative magnitudes of harmonic currents produced by the harmonic current sources 34A 34B in networks A and B. FIG. 8 shows an embodiment of the present invention capable of measuring both the network A harmonic current source and the network B harmonic current source at the same time. A second harmonic current meter 52 is connected between the network A harmonic current source 34A and the connection point 32. The second current meter 52 yields current measurements $I_2$ and $I_3$ when the shunt 40 is connected and disconnected, respectively. $I_2$ and $I_3$ are analogous to $I_0$ and $I_1$ for the network B measurements described above. The harmonic current produced by the network A harmonic current source 34A is given by:

$$I_A = \frac{\frac{V_0}{V_1}I_2 - I_3}{1 - \frac{V_0}{V_1}}.$$

The harmonic current ($I_A$) produced by the network A harmonic current source 34A is thereby provided from the measurements of $I_2$, $I_3$, $V_0$, and $V_1$.

Alternatively, the harmonic current flowing through the shunt 40 is measured and defined to be $I_4$. Then $I_3$ can be found from the equation:

$$I_3 = I_1 + I_4.$$

In this case, a harmonic current meter is connected in series with the shunt 40 or frequency generator 50.

Figure 9:
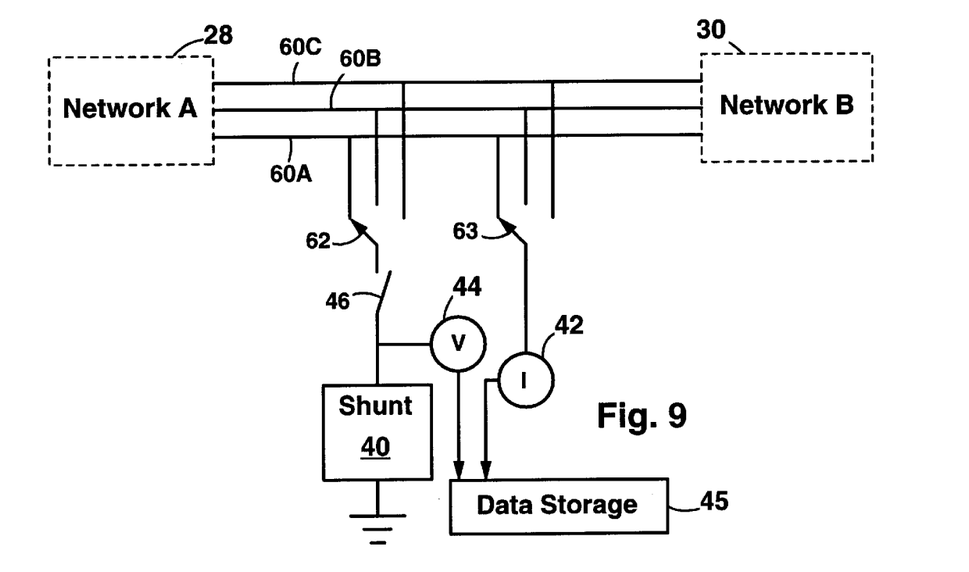
FIG. 9 shows how the present invention can be used in 3-phase power distribution systems.

The present invention can perform measurements in 3-phase power systems. FIG. 9 shows an embodiment of the present invention being used with a 3-phase power system having three power lines 60A, 60B, 60C. Here, switches 62, 63 toggle the shunt 40, harmonic voltage meter 44, and harmonic current meter 42 between the three lines 60. The switches 62, 63 connect the shunt, voltage meter 44, and current meter 42 to the same line and separate measurements are made for each line 60A, 60B, 60C. The measurements are stored in a data storage device 45. Alternatively, if the harmonic generator 50 is used instead of the harmonic shunt 40, the harmonic generator is toggled between the three lines 60A, 60B, 60C. More generally, the present invention can be used in any multiple-phase power distribution system (e.g. two-phase systems).

Figure 10:
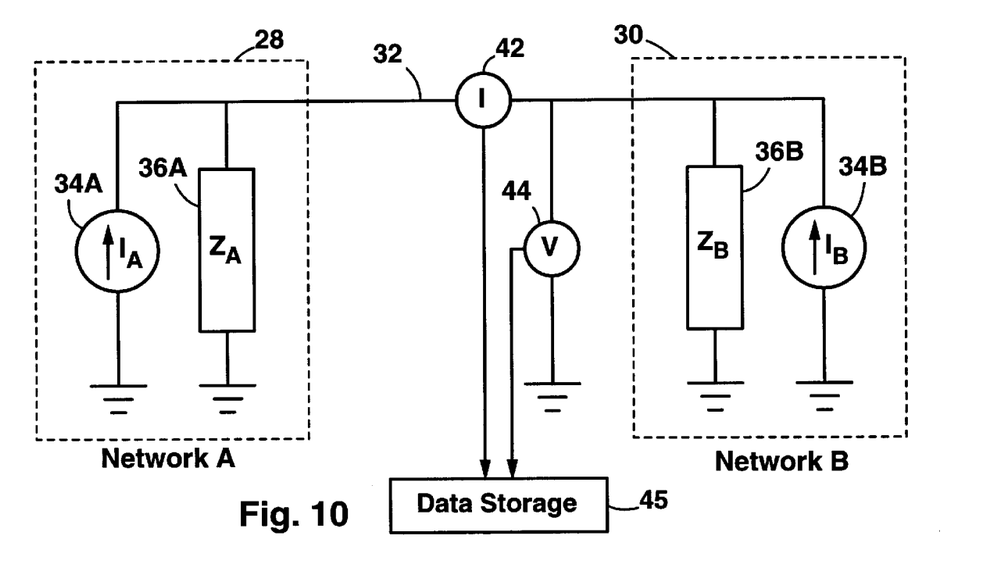
FIG. 10 shows an alternative embodiment of the present invention which does not have a harmonic perturbation device.

FIG. 10 shows an alternative embodiment of the present invention in which a harmonic perturbation device (i.e., the shunt 40 or frequency generator 50) is not used. In any power distribution system, the amount and phase of harmonic energy present in the system will typically vary over time due to changes in various elements of the network. In the embodiment of FIG. 10, unpredictable temporal variations in the harmonic energy present in the power distribution system are exploited to yield changes in the I and V measurements. Harmonic perturbation devices are not needed to controllably change the measured I and V values. However, in this embodiment, it is necessary to identify the source of the temporal variations (i.e. if the harmonic energy variations originated from network A or network B). If the perturbation originated from network A, then it is possible to determine characteristics of network B. If the perturbation originated from network B, then it is possible to determine characteristics of network A.

The source of the harmonic energy changes can be determined by several different methods. Sometimes the source is identifiable from the known switching of equipment. For example, if network A switches filters or other electrical devices, then it is known that network A was the source of the changes.

In another method, if the metering point harmonic current changes without a corresponding load change, then the harmonic energy change originated at the utility. Similarly, if the supply voltage changes without a corresponding load change, then the source of the harmonic energy change originated at the utility. An example of this is a tap change on a supply transformer.

In operation, measurements are taken of the harmonic current and harmonic voltage and are designated $I_0$ and $V_0$, respectively. These measurements are updated and stored in the data storage device 45 periodically (e.g. about every 2 seconds). The harmonic voltage and harmonic current are continuously monitored. If the harmonic voltage or harmonic current changes suddenly from the most recent $I_0$ and $V_0$ measurements, then subsequent measurements are taken and designated $I_1$ and $V_1$. The values for $I_0$, $I_1$, $V_0$, and $V_1$ are all stored in the data storage device 45. If accurate determinations of the harmonic pollution source characteristics are desired, then $I_1$ and $V_1$ measurements should only be so designated if $I_1$ and $V_1$ differ substantially from $I_0$ and $V_0$.

Also, the source (network A or network B) of the sudden change is determined. If network A is the source, then characteristics of network B can be determined, and vice versa. The $I_0$, $I_1$, $V_0$, and $V_1$ measurements are then used to determine characteristics of the nonchanging network in the same manner as described above. For example, if network A is the source of the changes, then $I_B$ and $Z_B$ can be determined; if network B is the source of the changes, then $I_A$ and $Z_A$ can be determined.

Figure 11:
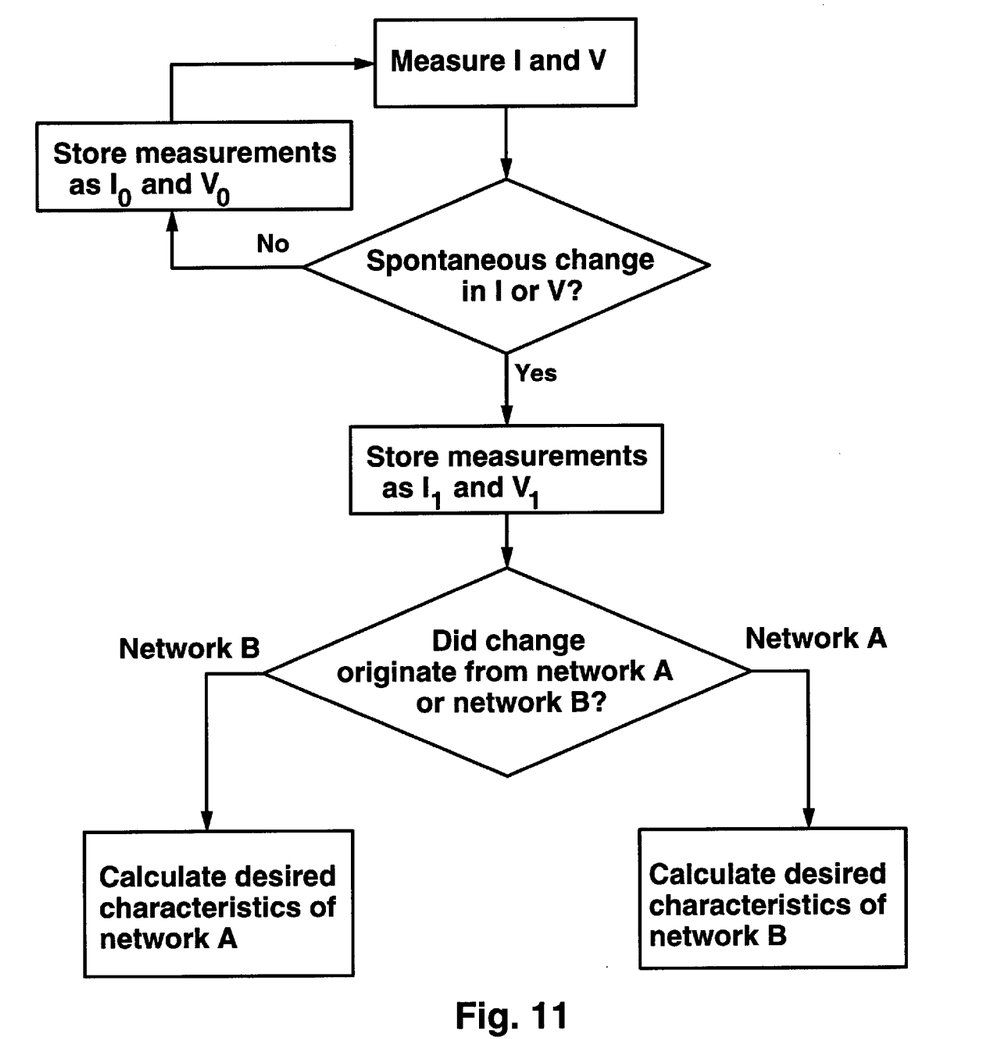
FIG. 11 shows a flow chart of a method of the present invention preferably used in combination with the apparatus of FIG. 10.

FIG. 11 shows a flow diagram illustrating the method preferably used with the apparatus of FIG. 10.

Figure 12:
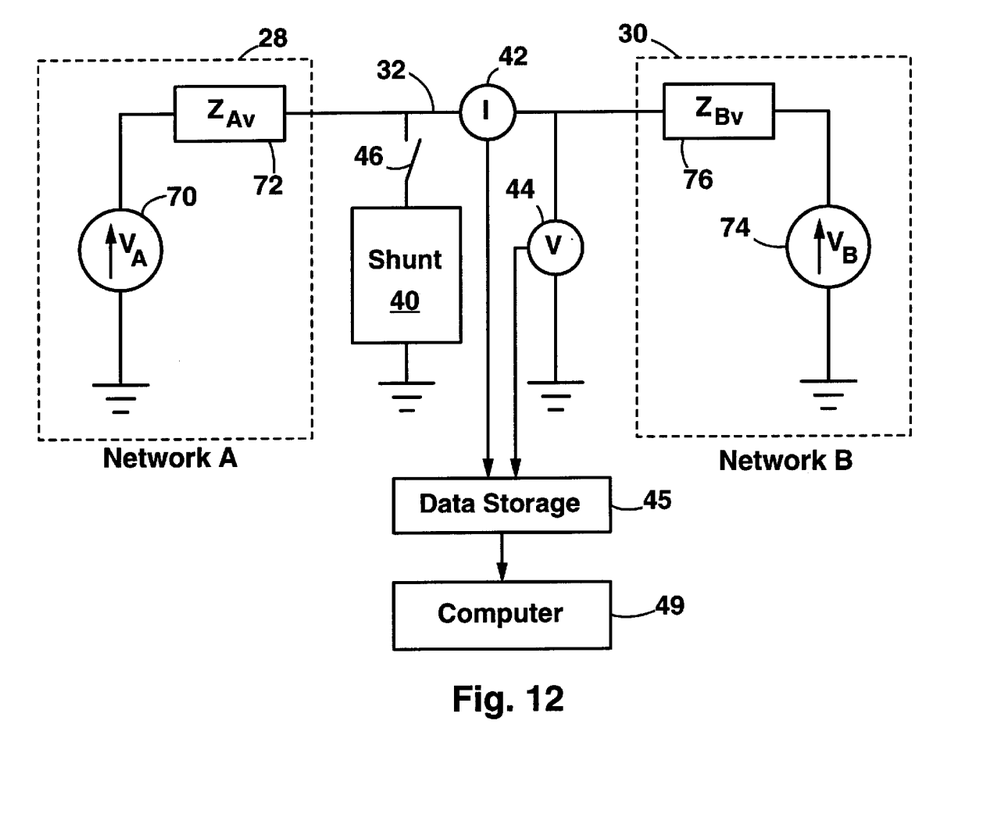
FIG. 12 shows an embodiment of the present invention in which harmonic pollution sources are modeled as having harmonic voltage sources instead of harmonic current sources.

It is noted that the current source model of network A and network B is preferred but somewhat arbitrary. Network A 28 and network B 30 can also each be modeled by a voltage source in series with an impedance. FIG. 12 shows a voltage source model of the power distribution system. Network A 28 is modeled to have a network A voltage source 70 which produces a voltage of $V_A$, and a network A V-impedance 72 in series with the voltage source 70. The V-impedance 72 has a value of $Z_{Av}$. Similarly, network B has a network B voltage source 74 producing a voltage of $V_B$ and a network B V-impedance 76 in series with the voltage source 74. The V-impedance 76 has a value of $Z_{Bv}$. Impedances $Z_{Av}$ and $Z_{Bv}$ are equal to impedances $Z_A$ and $Z_B$, respectively.

If the voltage source model of FIG. 12 is used, the calculations are different compared to the calculations used for the current source model. However, the measurements $V_0$, $V_1$, $I_0$, and $I_1$ are the same in both current source and voltage source models. Values for $V_0$ and $I_0$ are measured when the distribution system is undisturbed. Values for $V_1$ and $I_1$ are measured when the shunt 40 is connected to the connection point 32 or when a change has been detected in the harmonic energy present. Each measurement set can be expressed in an equation based on Ohms law:

$$V_0 = V_B + I_0 Z_B, \text{ and } V_1 = V_B + I_1 Z_B.$$

These equations can be combined to yield the following solutions for $V_B$ and $Z_{Bv}$:

$$V_B = \frac{I_1 V_0 - I_0 V_1}{I_1 - I_0}, \text{ and } Z_{BV} = \frac{V_0 - V_1}{(I_0 - I_1)}.$$

$V_A$ and $Z_{Av}$ can be found by analogous calculations. Of course, $V_A$, $V_B$, $Z_{Av}$, and $Z_{Bv}$ may all be expressed in complex quantities so that the voltage sources 70, 74 and V-impedances 72, 76 are all completely defined (i.e., both magnitude and phase are determined). The choice of whether to calculate voltage sources ($V_A$, $V_B$) or current sources ($I_A$, $I_B$) depends on what the user desires. Of course, both can be determined from the same set of measurements.

It is noted that all the equations disclosed herein may be mathematically altered in various ways while remaining substantially equivalent to the equations described. For example, for ease of calculation, approximations to the equations may be made as is well known in the art. Also, coefficients for different units or corrections for measurement errors may be included in the equations. Implementations that involve such altered equations lie within the scope of the appended claims.

It is noted that the present invention can be used with direct current (DC) circuits to find and analyze sources of different frequencies. The methods and apparatus are generally the same whether the apparatus is used in AC or DC networks. One consideration in using the present invention in a DC network is that the harmonic shunt 40 only needs to be designed to avoid generating or absorbing DC voltages and currents. For example, a harmonic absorber with an inductor and capacitor in parallel would not operate properly in a DC network. Also, since DC networks do not operate at any particular frequency, there are no harmonics to speak of. Therefore, when connected to a DC circuit, the present invention can be adapted to detect and analyze 'harmonic' (i.e. noise) sources at any frequency.

The present invention provides a method and apparatus for measuring the internal electrical characteristics of a harmonic pollution source of interest such as an electric utility customer or the electric utility itself. Particularly, the present invention can measure the harmonic current produced by a harmonic current source considered to reside within the harmonic pollution source of interest 30. The present invention is capable of 'seeing through' the shielding effects of an impedance also located within the harmonic pollution source of interest 30. The present invention is therefore useful in assessing the amounts of harmonic pollution that different entities within a power distribution system are responsible for. Therefore, the present invention can be used by electric utilities to provide a basis for enforcing limits on the amount of harmonic pollution which may be released by electric utility customers.

The present invention may also be used to determine the responsibility of each party for harmonic pollution at the connection point between the utility and customer.

Also, the present invention may be used to characterize certain electrical loads for their tendency to generate harmonic pollution. Further, the present invention may be used to locate and quantify sources of harmonic pollution in a power distribution system.

The present invention is also useful to those who wish to avoid receiving or producing harmful harmonic pollution. The present invention can be operated as a sensor for harmonic pollution. Such a harmonic pollution sensor can function in combination with an alarm to warm when harmonic pollution levels exceed a maximum safe level.

It will be clear to one skilled in the art that the above embodiments may be altered in many ways without departing from the scope of the invention. Accordingly, the scope of the invention should be determined by the following claims and their legal equivalents.

What is claimed is:

1. An apparatus for determining a characteristic of a harmonic pollution source of interest within a power distribution system, wherein the harmonic pollution source is connected to a power line at a connection point, the apparatus comprising:
   a) a harmonic generator;
   b) a means for electrically connecting the harmonic generator to the power distribution system such that the harmonic generator changes the harmonic energy present in the power distribution system;
   c) a means for measuring a harmonic voltage at the connection point;
   d) a means for measuring a harmonic current flowing between the connection point and the harmonic pollution source.

2. The apparatus of claim 1 wherein the harmonic generator comprises a switching device selected from the group consisting of thyristors, gate turn-off thyristors, and insulated gate bipolar transistors.

3. The apparatus of claim 1 wherein the harmonic generator comprises a harmonic frequency generator.

4. The apparatus of claim 1 further comprising a data storage device in communication with the harmonic voltage measurement means and harmonic current measurement means for storing current and voltage measurements.

5. The apparatus of claim 1 wherein the electrical connecting means comprises a means for switching between the electrical conductors of a multiple-phase power line.

6. The apparatus of claim 1 further comprising a calculational means for calculating Z from an equation substantially equivalent to:

$$Z = \frac{V_0 - V_1}{I_0 - I_1}$$

wherein:

$V_0$ is a harmonic voltage at the connection point when the harmonic generator is not changing the harmonic energy present in the power distribution system;

$V_1$ is a harmonic voltage at the connection point when the harmonic generator is changing the harmonic energy present in the power distribution system;

$I_0$ is a harmonic current between the connection point and harmonic pollution source simultaneous with $V_0$; and $I_1$ is a harmonic current between the connection point and harmonic pollution source simultaneous with $V_1$;

whereby Z is an impedance in parallel with a harmonic current source within the harmonic pollution source.

7. The apparatus of claim 1 further comprising a calculational means for calculating $Z_v$ from an equation substantially equivalent to:

$$Z_v = \frac{V_0}{V_1(I_0 - I_1)}$$

wherein:

$V_0$ is a harmonic voltage at the connection point when the harmonic generator is not changing the harmonic energy present in the power distribution system;

$V_1$ is a harmonic voltage at the connection point when the harmonic generator is changing the harmonic energy present in the power distribution system;

$I_0$ is a harmonic current between the connection point and harmonic pollution source simultaneous with $V_0$; and $I_1$ is a harmonic current between the connection point and harmonic pollution source simultaneous with $V_1$; p1 whereby $Z_v$ is a V-impedance in series with a harmonic voltage source within the harmonic pollution source.

8. The apparatus of claim 1 further comprising a calculational means for calculating I from an equation substantially equivalent to:

$$I = \frac{\left(\frac{V_0}{V_1}I_1 - I_0\right)}{1 - \frac{V_0}{V_1}}$$

wherein:
- $V_0$ is a harmonic voltage at the connection point when the harmonic generator is not changing the harmonic energy present in the power distribution system;
- $V_1$ is a harmonic voltage at the connection point when the harmonic generator is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby I is a current produced by a harmonic current source within the harmonic pollution source.

9. The apparatus of claim 8 further comprising a calculational means for calculating phase from an equation substantially equivalent to:

$$\text{Phase} = \text{Tan}^{-1}\left(\frac{\text{re}(I)}{\text{im}(I)}\right)$$

wherein I is the current produced by the harmonic current source within the harmonic pollution source.

10. The apparatus of claim 1 further comprising a calculational means for calculating V from an equation substantially equivalent to:

$$V = \frac{I_1 V_0 - I_0 V_1}{I_1 - I_0}$$

wherein:
- $V_0$ is a harmonic voltage at the connection point when the harmonic generator is not changing the harmonic energy present in the power distribution system;
- $V_1$ is a harmonic voltage at the connection point when the harmonic generator is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby V is a voltage produced by a harmonic voltage source within the harmonic pollution source.

11. The apparatus of claim 10 further comprising a calculational means for calculating phase from an equation substantially equivalent to:

$$\text{Phase} = \text{Tan}^{-1}\left(\frac{\text{re}(V)}{\text{im}(V)}\right)$$

wherein V is the voltage produced by the harmonic voltage source within the harmonic pollution source.

12. The apparatus of claim 1 wherein the harmonic generator comprises a harmonic current generator.

13. The apparatus of claim 12 wherein the harmonic current generator comprises four switching devices connected in an H-bridge circuit.

14. The apparatus of claim 12 wherein the harmonic current generator comprises two switching devices connected in an antiparallel fashion, the two switching device connected in series with an inductive or capacitive reactance.

15. The apparatus of claim 1 wherein the harmonic generator comprises a harmonic voltage generator.

16. The apparatus of claim 15 wherein the harmonic voltage generator comprises four switching devices connected in an H-bridge circuit.

17. The apparatus of claim 16 wherein the H-bridge circuit further comprises four diodes connected in antiparallel to the switching devices.

18. An apparatus for determining a characteristic of a harmonic pollution source of interest within a power distribution system, wherein the harmonic pollution source is connected to a power line at a connection point, the apparatus comprising:
a) a variable harmonic absorber;
b) a means for electrically connecting the variable harmonic absorber to the power distribution system such that the variable harmonic absorber changes the harmonic energy present in the power distribution system;
c) a means for measuring a harmonic voltage at the connection point;
d) a means for measuring a harmonic current flowing between the connection point and the harmonic pollution source.

19. The apparatus of claim 18 wherein the variable harmonic absorber comprises an inductance and a capacitance connected in series, wherein at least one of the inductance and the capacitance is variable.

20. The apparatus of claim 18 wherein the variable harmonic absorber comprises an inductance and a capacitance connected in parallel, wherein at least one of the inductance and the capacitance is variable.

21. The apparatus of claim 18 further comprising a data storage device in communication with the harmonic voltage measurement means and harmonic current measurement means for storing current and voltage measurements.

22. The apparatus of claim 18 wherein the electrical connecting means comprises a means for switching between the electrical conductors of a multiple-phase power line.

23. The apparatus of claim 18 further comprising a calculational means for calculating Z from an equation substantially equivalent to:

$$Z = \frac{V_0 - V_1}{I_0 - I_1}$$

wherein:
- $V_0$ is a harmonic voltage at the connection point when the variable harmonic absorber is not changing the harmonic energy present in the power distribution system;
- $V_1$ is a voltage at the connection point when the variable harmonic absorber is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby Z is an impedance in parallel with a harmonic current source within the harmonic pollution source.

24. The apparatus of claim 18 further comprising a calculational means for calculating phase $Z_v$ from an equation substantially equivalent to:

$$Z_v = \frac{V_0}{V_1(I_0 - I_1)}$$

wherein:
- $V_0$ is a harmonic voltage at the connection point when the variable harmonic absorber is not changing the harmonic energy present in the power distribution system;
- $V_1$ is a harmonic voltage at the connection point when the variable harmonic absorber is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby $Z_v$ is a V-impedance in series with a harmonic voltage source within the harmonic pollution source.

25. The apparatus of claim 18 further comprising a calculational means for calculating I from an equation substantially equivalent to:

$$I = \frac{\left(\frac{V_0}{V_1}I_1 - I_0\right)}{1 - \frac{V_0}{V_1}}$$

wherein:
- $V_0$ is a harmonic voltage at the connection point when the variable harmonic absorber is not changing the harmonic energy present in the power distribution system;
- $V_1$ is a harmonic voltage at the connection point when the variable harmonic absorber is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby I is a current produced by a harmonic current source within the harmonic pollution source.

26. The apparatus of claim 25 further comprising a calculational means for calculating phase from an equation substantially equivalent to:

$$\text{Phase} = \text{Tan}^{-1}\left(\frac{\text{re}(I)}{\text{im}(I)}\right)$$

wherein I is the current produced by the harmonic current source within the harmonic pollution source.

27. The apparatus of claim 18 further comprising a calculational means for calculating V from an equation substantially equivalent to:

$$V = \frac{I_1 V_0 - I_0 V_1}{I_1 - I_0}$$

wherein:
- $V_0$ is a harmonic voltage at the connection point when the variable harmonic absorber is not changing the harmonic energy present in the power distribution system;
- $V_1$ is a harmonic voltage at the connection point when the variable harmonic absorber is changing the harmonic energy present in the power distribution system;
- $I_0$ is a harmonic current between the connection point and harmonic pollution source simultaneous with $V_0$; and
- $I_1$ is a harmonic current between the connection point and harmonic pollution source simultaneous with $V_1$;
- whereby V is a voltage produced by a harmonic voltage source within the harmonic pollution source.

28. The apparatus of claim 27 further comprising a calculational means for calculating phase from an equation substantially equivalent to:

$$\text{Phase} = \text{Tan}^{-1}\left(\frac{\text{re}(V)}{\text{im}(V)}\right)$$

wherein V is the voltage produced by the harmonic voltage source within the harmonic pollution source.

29. A method for measuring a characteristic of a harmonic pollution source of interest within a power distribution system, wherein the harmonic pollution source is connected to a power line at a connection point, the method comprising the steps of:

a) measuring a harmonic voltage at the connection point;
b) measuring a harmonic current between the connection point and the harmonic pollution source simultaneous with step (a);
c) injecting harmonic energy into the power distribution system;
d) measuring a harmonic voltage at the connection point simultaneous with step (c);
e) measuring a harmonic current between the connection point and the harmonic pollution source simultaneous with step (d).

30. The method of claim 29 further comprising the step of storing the harmonic voltage measurement produced in step (a).

31. The method of claim 29 further comprising the step of storing the harmonic current measurement produced in step (b).

32. The method of claim 29 further comprising the step of calculating I from an equation substantially equivalent to:

$$I = \frac{\left(\frac{V_0}{V_1}I_1 - I_0\right)}{1 - \frac{V_0}{V_1}}$$

wherein:
- $V_0$ is a harmonic voltage measured in step (a);
- $V_1$ is a harmonic voltage measured in step (d);
- $I_0$ is a harmonic voltage measured in step (b); and
- $I_1$ is a harmonic current measured in step (c);
- whereby I is a current produced by a harmonic current source within the harmonic pollution source.

33. The method of claim 32 further comprising the step of calculating phase from an equation substantially equivalent to:

$$\text{Phase} = \text{Tan}^{-1}\left(\frac{\text{re}(I)}{\text{im}(I)}\right)$$

wherein I is the current produced by the harmonic current source within the harmonic pollution source.

34. The method of claim 29 further comprising the step of calculating Z from an equation substantially equivalent to:

$$Z = \frac{V_0 - V_1}{I_0 - I_1}$$

wherein:

$V_0$ is a harmonic voltage measured in step (a);
$V_1$ is a harmonic voltage measured in step (d);
$I_0$ is a harmonic current measured in step (b); and
$I_1$ is a harmonic current measured in step (c);
whereby Z is a impedance in parallel with a harmonic current source within the harmonic pollution source.

35. The method of claim 29 wherein the power line is a multiple-phase power line, the method further comprising the step of switching a harmonic voltage and a harmonic current measurement means between the electrical conductors if the multiple-phase power line.

36. The method of claim 29 further comprising the step of calculating $Z_v$ from an equation substantially equivalent to:

$$Z_v = \frac{V_0}{V_1(I_0 - I_1)}$$

wherein:

$V_0$ is a harmonic voltage measured in step (a);
$V_1$ is a harmonic voltage measured in step (d);
$I_0$ is a harmonic voltage measured in step (b); and
$I_1$ is a harmonic voltage measured in step (c);
whereby $Z_v$ is a V-impedance in series with a harmonic voltage source within the harmonic pollution source.

37. The method of claim 29 further comprising the step of calculating V from an equation substantially equivalent to:

$$V = \frac{I_1 V_0 - I_0 V_1}{I_1 - I_0}$$

wherein:

$V_0$ is a harmonic voltage measured in step (a);
$V_1$ is a harmonic voltage measured in step (d);
$I_0$ is a harmonic current measured in step (b); and
$I_1$ is a harmonic current measured in step (c);
whereby V is an voltage produced by the harmonic voltage source within the harmonic pollution source.

38. The method of claim 37 further comprising the step of calculating phase from an equation substantially equivalent to:

$$\text{Phase} = \text{Tan}^{-1}\left(\frac{\text{re}(V)}{\text{im}(V)}\right)$$

wherein V is the voltage produced by the harmonic voltage source within the harmonic pollution source.

* * * * *